(12) United States Patent  (10) Patent No.: US 8,940,120 B2
Kotake  (45) Date of Patent: Jan. 27, 2015

(54) ELECTRONIC PART MANUFACTURING METHOD AND ELECTRONIC PART MANUFACTURED BY THE METHOD

(75) Inventor: Masayoshi Kotake, Tokyo (JP)

(73) Assignee: DIC Corporation, Tokyo (JP)

( * ) Notice: Subject to any disclaimer, the term of this patent is extended or adjusted under 35 U.S.C. 154(b) by 641 days.

(21) Appl. No.: 13/203,873

(22) PCT Filed: Jun. 30, 2009

(86) PCT No.: PCT/JP2009/061897
§ 371 (c)(1),
(2), (4) Date: Nov. 14, 2011

(87) PCT Pub. No.: WO2011/001499
PCT Pub. Date: Jan. 6, 2011

(65) Prior Publication Data
US 2012/0052259 A1   Mar. 1, 2012

(51) Int. Cl.
B32B 37/26 (2006.01)
H01L 51/00 (2006.01)
H05K 3/20 (2006.01)
H05K 3/04 (2006.01)

(52) U.S. Cl.
CPC ........ H01L 51/0016 (2013.01); H01L 51/0013 (2013.01); H05K 3/207 (2013.01); H01L 51/003 (2013.01); H05K 3/046 (2013.01); H05K 2203/0108 (2013.01); H05K 2203/0528 (2013.01)
USPC ............ 156/232; 156/230; 156/242; 156/250

(58) Field of Classification Search
USPC .................................. 156/230, 232, 240, 250
See application file for complete search history.

(56) References Cited

U.S. PATENT DOCUMENTS

| 5,645,932 | A | 7/1997 | Uchibori |
| 6,214,444 | B1 | 4/2001 | Uchibori |
| 6,383,616 | B1 | 5/2002 | Uchibori |
| 2002/0025416 | A1 | 2/2002 | Uchibori |
| 2003/0051806 | A1 | 3/2003 | Appalucci et al. |
| 2006/0071083 | A1 | 4/2006 | Appalucci et al. |
| 2008/0251844 | A1 | 10/2008 | Nomoto et al. |

FOREIGN PATENT DOCUMENTS

| JP | 7-240523 A | 9/1995 |
| JP | 9-44762 A | 2/1997 |
| JP | 2003-110242 A | 4/2003 |
| JP | 2005-503033 A | 1/2005 |

(Continued)

Primary Examiner — Bruce H Hess
Assistant Examiner — Christopher Polley
(74) Attorney, Agent, or Firm — McDermott Will & Emery LLP

(57) ABSTRACT

The present invention provides a new method for manufacturing an electronic part, which is capable of reducing the number of steps of superpose-printing, achieving positional accuracy (alignment accuracy) of precise superposed patterns, and layering with substantially no difference in level, thereby improving productivity and dimensional accuracy and eliminating defects. The method for manufacturing an electronic part includes the steps of forming a composite ink pattern layer on a releasing surface of a transfer plate using a relief offset method, and then simultaneously reversely transferring the composite ink pattern layer to a printing object. Various organic transistor elements are formed by combining a conductive ink, an insulating ink, and an ink containing a semiconductor.

6 Claims, 5 Drawing Sheets

(56) References Cited

FOREIGN PATENT DOCUMENTS

| | | |
|---|---|---|
| JP | 2005-57118 A | 3/2005 |
| JP | 2005-353770 A | 12/2005 |
| JP | 2006-45294 A | 2/2006 |
| JP | 2007-273712 A | 10/2007 |
| JP | 2008-140852 A | 6/2008 |
| JP | 2008-270245 A | 11/2008 |
| JP | 2009-140790 A | 6/2009 |

ELECTRONIC PART MANUFACTURING METHOD AND ELECTRONIC PART MANUFACTURED BY THE METHOD

CROSS REFERENCE TO PRIOR APPLICATIONS

This application is a U.S. National Phase application under 35 U.S.C. §371 of International Application No. PCT/JP2009/061897, filed on Jun. 30, 2009. The International Application was published in Japanese on Jan. 6, 2011 as WO 2011/001499 A1 under PCT Article 21(2). The contents of the applications are hereby incorporated by reference.

TECHNICAL FIELD

The present invention relates to a method for manufacturing an electronic part by a relief offset method and an electronic part manufactured by the method.

BACKGROUND ART

Various methods described below have been investigated as methods for manufacturing electronic parts by printing. For example, Patent Literature 1 discloses a method for forming a thin-film transistor circuit, in which a resist pattern is formed using a cylinder offset printing machine and dimensional error is suppressed by controlling a transfer rate and a reverse transfer rate. Patent Literature 2 discloses a method for producing a circuit board, the method including forming a conductor layer on a core insulating layer by a printing method, forming an insulating layer having a hole on the conductor layer by a printing method, and further filling the hole with an electromagnetic characteristic material by a printing method.

Patent Literature 3 discloses a method for producing a printed circuit board having a fine pattern by a simple equipment without using a photolithography method, the method including the steps of forming a coated surface by applying a functional material to a mold releasing surface, pressing a relief plate with a predetermined shape on the coated surface to remove a portion of the functional material by reverse transfer to a projection of the relief plate, reversely transferring the functional material remaining on the coated surface to a substrate, and drying a coating film of the reversely transferred functional material by heating. Patent Literature 4 discloses a method for forming an insulating layer having a better fine pattern by a printing method, in which an insulating ink having a viscosity of 50 mPa·s or less at 25° C. is applied to a mold releasing surface, a relief plate having projections, which has a reverse pattern, is pressed on the resultant coating film to remove portions of the coating film which correspond to the reverse pattern from the mold releasing surface, and further the coating film remaining on the mold releasing surface is reversely transferred to a substrate and then solidified to form the insulating layer having a predetermined pattern.

Patent Literature 5 discloses a method in which a print ink composition containing an organic solvent having predetermined physical properties is applied to a surface of a silicone resin film, a portion of the resultant coating film is reversely transferred to a projection surface of a relief plate, the coating film remaining on the silicone resin film is reversely transferred to a surface of a substrate and then dried to form a resin film. Patent Literature 6 discloses a method for manufacturing an electronic part by a printing method, in which an ink is applied to a blanket to form an ink coated surface, a relief plate is pressed on the ink coated surface to remove a portion of the ink, which is in contact with the relief plate, from the blanket (relief offset method), and then the ink remaining on the blanket is reversely transferred to a printing object. The method for manufacturing an electronic part is characterized by forming one or more layers of patterns, with an ink, selected from the group consisting of a conductive ink, an insulating ink, and a semiconductor ink. However, the method for manufacturing an electronic part has the need to form patterned layers having respective functions on the blanket one-by-one, and laminate the layers on the printing object, and thus has the important problems (1) that much time is required for manufacture because of a large number of superpose-printing steps, (2) that it is difficult to laminate each of the layers at a correct position, and (3) that defects occur in an upper pattern laminated on a lower pattern due to a difference in level of the lower pattern.

CITATION LIST

Patent Literature

PTL 1: Japanese Unexamined Patent Application Publication No. 7-240523
PTL 2: Japanese Unexamined Patent Application Publication No. 2003-110242
PTL 3: Japanese Unexamined Patent. Application Publication No, 2005-057118
PTL 4: Japanese Unexamined Patent Application Publication No. 2005-353770
PTL 5: Japanese Unexamined Patent Application Publication No. 2006-045294
PTL 6: Japanese Unexamined Patent Application Publication No. 2007-273712

SUMMARY OF INVENTION

Technical Problem

The present invention has been achieved in consideration of the above-mentioned situation, and an object of the present invention is to provide a novel method for manufacturing an electronic part, which is capable of reducing the number of superpose-printing steps, achieving positional accuracy (alignment accuracy) in precise superpose-patterning, and layering with substantially no difference in level, and which is thus capable of improving productivity and dimensional accuracy and eliminating defects.

Solution to Problem

The present invention is aimed at resolving the above-described problems by simultaneously reversely transferring a plurality of ink layers using a reverse printing method. That is, in a first aspect, the present invention provides a method for manufacturing an electronic part, the method including the steps of forming a composite ink pattern layer on a mold releasing surface of a transfer plate by a relief offset method and then simultaneously reversely transferring the composite ink pattern layer to a printing object.

In a second aspect, there is provided the method for manufacturing an electronic part, including the steps of laminating two or more functional material inks on the mold releasing surface of the transfer plate, simultaneously removing non-image areas of the laminated inks by a relief offset method to form a multi-layered pattern, and simultaneously reversely transferring the composite ink pattern layer to the printing object.

In a third aspect, there is provided the method for manufacturing an electronic part, the method including (1) a step of forming, on the mold releasing surface of the transfer plate, a first functional material ink pattern layer patterned with at least one functional material ink by the relief offset method (step 1), (2) a step of superpose-coating the first pattern layer with a second functional material ink film layer (step 2), (3) a step of simultaneously reversely transferring the first functional material ink pattern layer and the second functional material ink film layer to the printing object (laminate reverse transfer step).

In a fourth aspect, there is provided the method for manufacturing an electronic part, in which the second functional material ink film layer includes two or more superposed coating layers.

In a fifth aspect, there is provided the method for manufacturing an electronic part. The method including, after the step 2, a step of re-patterning (removing) a portion of the second functional material ink film layer or portions of the second functional material ink film layer and the first functional ink pattern layer by the relief offset method (removal step).

In a sixth aspect, there is provided the method for manufacturing an electronic part, the method including, after the removal step, a step (step 3) of forming a third functional material ink film layer.

In a seventh aspect, there is provided an electronic part including a functional laminate, in which at least one layer of the laminate is manufactured by any one of the above-described methods.

In an eighth aspect, there is provided an organic transistor element including the electronic part in which at least one of the layer materials constituting the electronic part is an organic semiconductor.

Advantageous Effects of Invention

According to the present invention, it is possible to decrease the number of superpose-printing steps for functional material ink pattern layers, realize high-precision alignment between the functional material ink pattern layers, and form a laminated structure with forming substantially no difference in level, thereby eliminating defects in each of the functional material pattern layers. According to the present invention, it is possible to provide an electronic part with higher productivity and higher performance.

BRIEF DESCRIPTION OF DRAWINGS

FIG. 3 shows (3-1) pattern stamping (formation of an electrode), (3-2) semiconductor solid coating, (3-3) a passing-though pattern, (3-4) gate insulating solid coating, and (3-5) reverse transfer.

FIG. 4 shows (4*a*-1) formation of a gate electrode, (4*a*-2) insulating film solid coating, (4*a*-3) reverse transfer so a printing objet, (4*b*-1) formation of source/drain electrodes, (4*b*-2) insulating film solid coating, (4*a*-4) reverse transfer of (4*h*-2) to (4*a*-3), and (4*a*-5) reverse transfer of a semiconductor layer.

FIG. 5 shows (5*a*) formation of a conductive pattern (via), (5*b*) protective film solid coating, and (5*c*) reverse transfer of (5*b*) to (4*a*-5).

DESCRIPTION OF EMBODIMENTS

Figure 1:
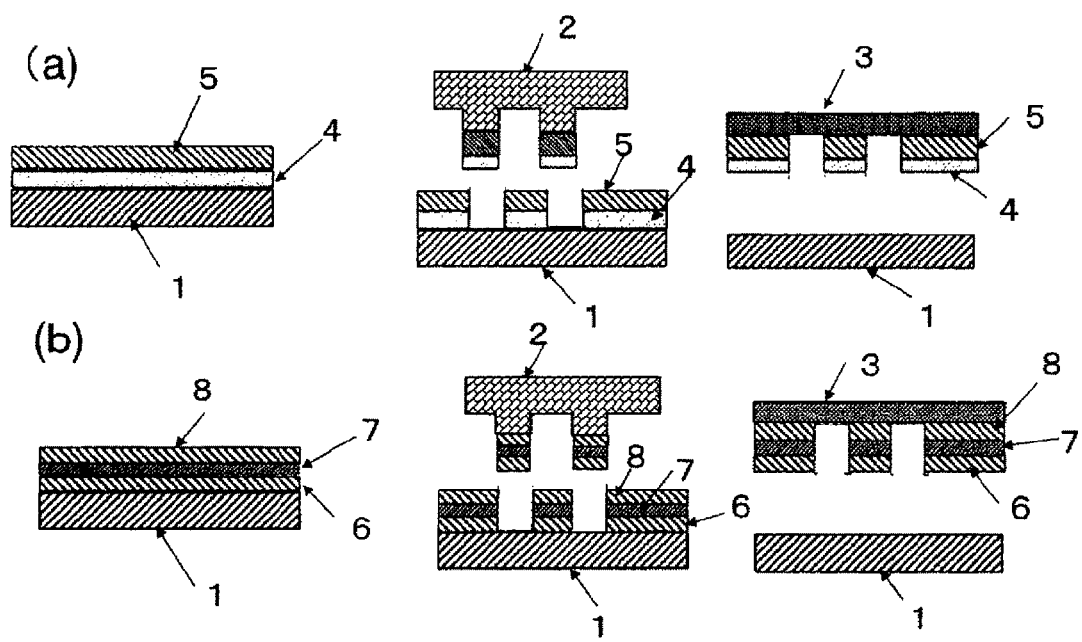
[FIG. 1] FIG. 1(*a*) shows simultaneous patterning of two layers by a relief offset method and reverse transfer, and FIG. 1(*b*) shows simultaneous patterning of three layers by a relief offset method and reverse transfer.

The present invention is described below on the basis of the best mode with reference no the drawings. The drawings are explanatory views of a printing method used in a method for manufacturing an electronic part of the present invention. The drawings schematically show printing steps of the present invention, but actual proportional relationship between dimensions, etc. are particularly not reflected in the drawings.

The method for manufacturing an electronic part of the present invention is different from a conventional reverse printing method in which a type of pattern is formed with a type of ink on a blanket serving as a transfer plate by a relief offset method and then reversely transferred to a transfer object to form a print pattern. The method for manufacturing an electronic part of the present invention is characterized in chat an electronic part is formed by previously forming a composite pattern layer with two or more functional material inks on a releasing surface of a transfer plate and then reversely transferring the composite pattern to a printing object.

The term "composite ink pattern layer" represents an ink, pattern laminate including at least two types of inks. The composite ink pattern layer may include at least one patterned ink layer and at least one ink solid film layer. That is, the composite ink pattern layer refers to a composite ink pattern containing at least two types of functional material inks in the layer. The ink solid film may completely cover the ink pattern or may have a thickness smaller than the thickness of the ink pattern layer so as to fill the spaces of the pattern.

Therefore, it is possible to significantly decrease the number of the steps and realize high-precision alignment between functional pattern layers as compared with the conventional reverse printing method. In addition, the functional material ink pattern layer and the functional material ink film layer are previously formed on the transfer plate and then reversely transferred to the printing object, thereby forming a smooth print surface with no difference in level due to the pattern. Since a laminated structure can be formed with substantially no difference in level, defects in each of the functional pattern layers can be eliminated.

The present invention is characterized by using the relief offset method as the method for forming the functional material, ink pattern on the transfer plate. The relief offset method of the present invention refers to the method including forming an ink coated surface by applying an ink on the releasing surface of the transfer plate, and pressing a relief plate serving as a stamp plate on the ink coated surface to remove a portion of the ink, which is in contact with the relief plate, from the transfer plate.

Examples of the method for applying the ink to the releasing surface of the transfer plate include, but are not limited to, an ink jet method, a screen printing method, a spin coating method, a bar coating method, a slit coating method, a dip coating method, a spray coating method, and the like.

The functional material ink used in the present invention refers to an ink which has printability suitable for the printing method used and which forms a functional material required for an electronic part by heating, light, an electron beam, or drying. The ink applied to the present invention is preferably prepared by dissolving or dispersing a material which forms the functional material in a proper solvent. The type of the solvent is not limited, and a solvent suitable for dissolving or dispersing the functional material can be appropriately selected. For example, water, and various organic solvents such as hydrocarbon, alcohol, ketone, ether, and ester solvents can be used.

Besides the functional material, if required, the ink may contain a binder component, such as a resin, an antioxidant, a catalyst for promoting film formation, an interfacial energy adjuster, a leveling agent, a release promoter, and the like.

The functional material ink used in the present invention may be appropriately selected from inks which are required or forming functional layers of an electronic part, for example, a conductive ink, an insulating ink, a semiconductor ink, and an ink for a protective film layer. In addition, in the present invention, a method for converting the functional composite ink, pattern layer formed by printing on the printing object to a functional material layer constituting an electronic part is not particularly limited, and an optimum method for each case can be selected. For example, the functional material can be formed from the functional material ink by removing and drying an ink solvent component at room temperature, heat treatment, or applying light such as ultraviolet light or energy such as an electron beam.

The shape and configuration of the transfer plate having the releasing surface applied to the present invention are not limited, and a shape and configuration optimum for the printing method, such as a film shape, a plate shape, or a roll shape, can be selected. In addition, a material with small surface energy or a material surface-treated with a release agent or the like can be used for the releasing surface of the transfer plate so as to have the property that the ink, can be uniformly applied to the releasing surface and can be easily released from the releasing surface by the relief plate serving as the stamp plate. For example, an organic compound, such as a fluorocarbon resin, a silicone resin, or a polyolefin resin, or an inorganic surface formed by plating or depositing a ceramic layer or a metal oxide layer can be used. In particular, a fluorocarbon resin and the silicone resin can be preferably used for the releasing surface because of the excellent releasability and flexibility. In addition, the releasing surface may be a uniform plane or may be patterned by a relief plate or an intaglio plate according to demand.

FIG. 1 is a schematic drawing schematically showing the method of the present invention, in which two or more types of functional material inks are laminated on the releasing surface of the transfer plate, non-image areas of the laminated inks are simultaneously removed by the relief offset method to form a multilayer pattern, and then the multilayer pattern is simultaneously reversely transferred to the printing object.

The present invention is described with reference to a model drawing of FIG. 1 FIG. 1(a) shows an example using two types of functional material inks. First a functional material ink A (4) is fully uniformly applied to the releasing surface of a transfer plate (1). Next, a functional material ink B (5) is fully uniformly applied to the ink A (4) in this state, the inks A (4) and B (5) are preferably not mixed with each other. This can be realized by considering the solvent compositions of both functional material inks and the process for pre-drying the ink A (4) serving as an undercoating, etc. Next, a relief plate (2) serving as a stamp plate is pressed to simultaneously pattern the inks A (4) and B (5). Next, the resultant double patterns are reversely transferred to a printing object (3) from the transfer plate. As a result, a pattern including the inks A (4) and B (5) which are precisely overlapped can be formed. FIG. 1(b) shows an example in which three layers of functional material inks are laminated and simultaneously patterned. The three layers (inks C, D, and E) may be composed of different functional material inks, or the first and third layers may be composed of the same ink.

As an example of a laminate of functional material inks, formation of a laminated pattern of conductive inks is described. First, a conductive ink composed of a conductive polymer such as PEDOT/PSS or polyaniline is uniformly applied to a transfer plate, and then a conductive ink prepared by uniformly dispersing silver nano-particles in a solvent is uniformly fully applied, forming two types of ink layers of different materials. Then, non-image areas of the ink layers are simultaneously removed by a relief offset method, and the ink patterns remaining on the releasing surface of the transfer plate are reversely transferred to the printing object. As a result, a pattern including the conductive polymer precisely laminated on a nano-silver pattern is produced. As an example of simultaneous formation of three layers of ink patterns, for example, a first ink layer is formed with an insulating ink, a second layer is formed with a conductive ink, and a third layer is formed with an insulating ink, thereby forming a conductive pattern held between insulating films.

The present invention also provides the method for reversely transferring, to the printing object, the functional material ink pattern and the functional material ink, film layer which are previously formed on the releasing surface of the transfer plate.

Figure 2:
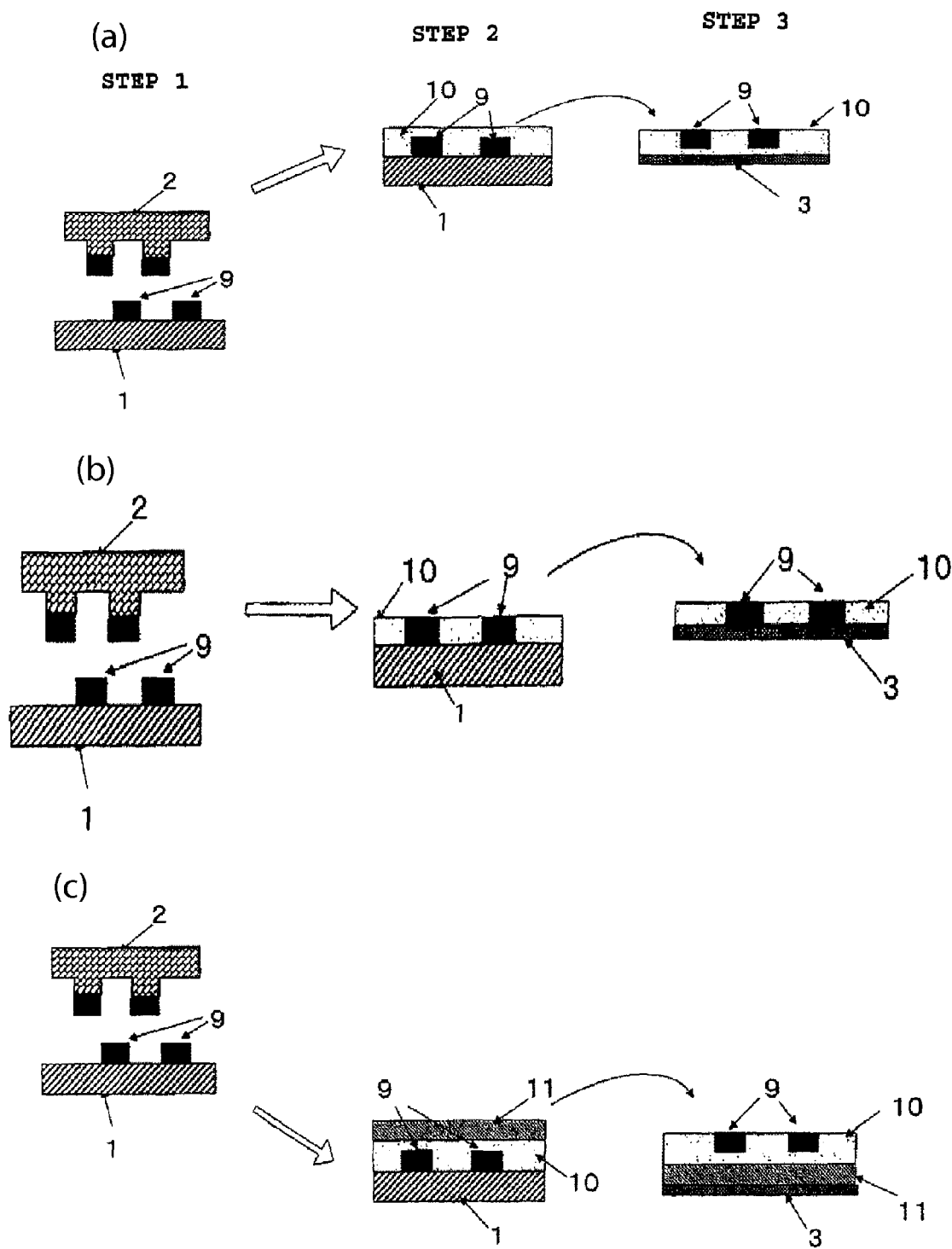
[FIG. 2] FIG. 2(*a*) shows single-layer coating, FIG. 2(*b*) shows a passing-though pattern, FIG. 2(*c*) shows multilayer coating, FIG. 2(*d*) shows a removal step, and FIG. 2(*e*) shows multilayer coating after removal.
Figure 2:
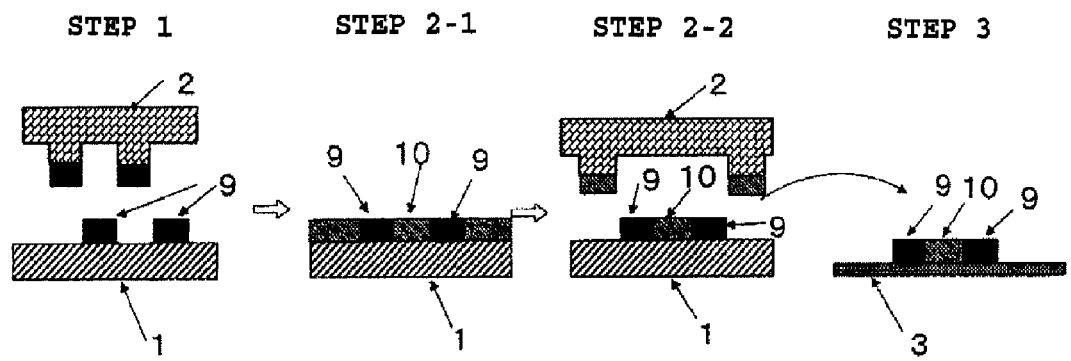
Figure 2:
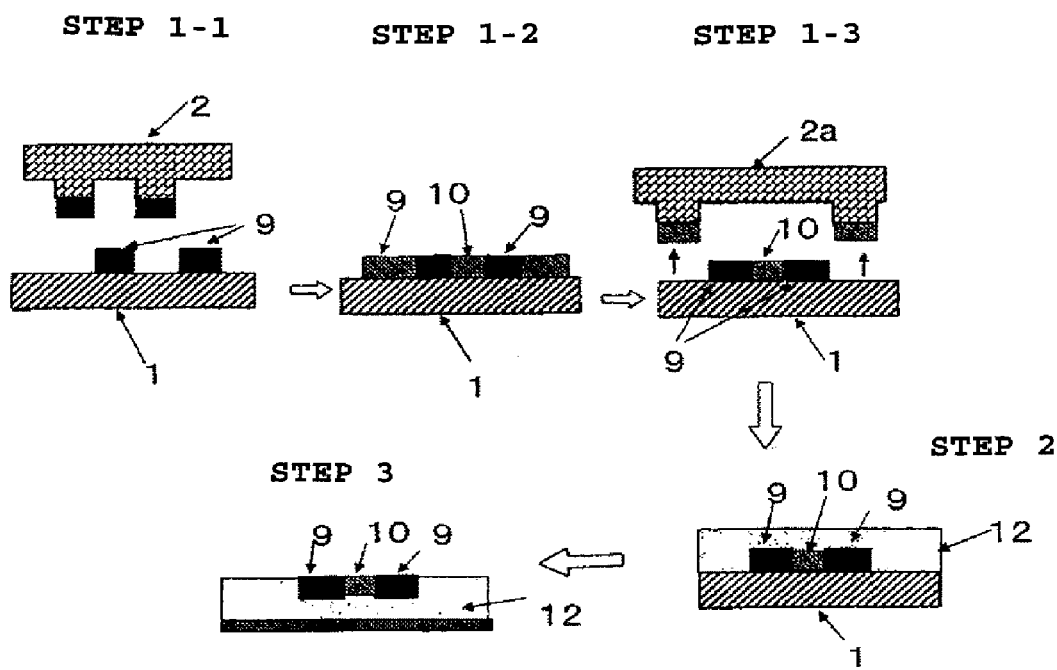

The present invention is described with reference to a model drawing of FIG. 2. As shown in FIG. 2(a), a relief plate 2 serving as a stamp plate is pressed on an ink surface of a first layer uniformly applied to a reverse transfer plate 1 to remove a portion of the ink, which is in contact with the relief plate, from the transfer plate, thereby forming a necessary first functional ink pattern layer 9 on the transfer plate 1 (relief offset method) (step 1). In this case, the first ink pattern layer may be a single layer or multilayer. Then, a second functional material ink film layer 10 composed of a different material is applied as a second ink layer on the pattern formed on the transfer plate 1 (step 2). Then, the first layer and the second layer are simultaneously reversely transferred to the printing object 3 (step 3: reverse transfer). An electronic part is manufactured through these steps. The ink film layer 10 may be applied to completely cover the patterned first layer or may be embedded in spaces of the pattern.

By using this method, a surface shape in which she ink pattern layer 9 formed on the transfer plate is embedded in the ink film layer 10 can be easily obtained, thereby forming a print surface with substantially no difference in level. This is supposed to be due to the fact that in comparison with a conventional method of previously forming a pattern on a substrate and then printing a new ink layer on the pattern by reverse transfer, the ink used for forming the second ink film layer can be applied to the ink pattern layer 9 while maintaining a sufficiently high leveling property, thereby imparting flatness to the surface in contact with the substrate surface by reverse transfer and reducing the residual stress of the ink layer which is produced by a difference in level of the pattern. Of course, the present invention is not limited by this fact.

The first patterned layer may be completely covered with the ink used for forming the second layer or may be formed to pass through the second layer according to demand (FIG. 2(b)). This form can be easily realized by controlling the thickness of the pattern formed in step 1 and the thickness of the second layer formed in step 2.

Further, the second ink film layer formed on the first patterned ink layer may be a single layer or, if required, may have a multilayer structure using different inks (FIG. 2(c)).

For example, when the present invention is applied to manufacture of a MIS organic transistor, a surface with no difference in level can be easily formed on an insulating film in which a gate electrode, source/drain electrodes, and various circuit patterns are embedded. In addition, by applying to the formation of an organic semiconductor protective film, the protective film having a conductive via hole passing through the protective film can be formed.

The present invention also provides a method for manufacturing an electronic part, in which as shown in FIG. 2(d), the step (step 2) of forming the second layer on the first layer includes a step of forming the second ink film layer on the first ink pattern layer (step 2-1) and a step of patterning the second ink film layer by the relief offset method using a second stamp plate 2a (step 2-2). After the second ink film layer is formed, patterning with the second stamp plate 2a may be performed only in the second ink film layer or may be performed for simultaneously re-patterning the first ink pattern layer, which has been previously patterned, by removing a portion thereof.

According to the present invention, the composite pattern exhibiting different functions is formed on the same transfer plate and then reversely transferred to the printing object, and thus an electronic part having a complicated structure can be easily formed. Although it is very difficult for the conventional printing method to form a new pattern in the pattern formed in the first layer or along the pattern, the new pattern can be formed with very high positional accuracy according to the present invention.

In the present invention, first, the first ink pattern layer is formed on the transfer plate by the relief offset method, and then an ink for the second ink film layer 10 is applied on the pattern. In this case, the second ink film layer may be applied thickly so as to completely cover the patterned first layer or applied to a thickness equivalent to or smaller than the thickness of the pattern so as to fill, the spaces of the pattern. In this case, for example, the first ink may be adjusted to have liquid-repellency to the second ink so that the second ink layer is not formed on the pattern. In the present invention, then, a new pattern is simultaneously formed, by the relief offset method using a second stamp plate 2a having a shape different from that of the first stamp plate 2, from the first ink pattern layer and the second ink film layer previously formed on the transfer plate. The patterning with the second stamp plate 2a may be performed to remove a portion of the second ink film layer leaving the first ink pattern layer as it is, or may be performed to simultaneously pattern the second ink film layer and partially change the pattern shape of the first ink pattern layer. When the second ink film layer includes two or more layers of different materials, a composite pattern composed of three or more materials can be formed.

For example, when the present invention is applied to a method for manufacturing a MIS organic transistor element, it is possible to easily form a so-called side-contact-type organic transistor element structure in which an organic semiconductor layer is formed only between a source electrode and a drain electrode, and only the side walls of the source electrode and the drain electrode contact an organic semiconductor.

Also, the present invention provides the method for manufacturing an electronic part according to claim 1, wherein as shown in a model drawing or FIG. 2(e), the step (step 1) of forming the first functional material ink pattern layer includes a step of forming the first functional material ink pattern layer on the transfer plate by the relief offset method (step 1-1), a step of forming the second functional material ink film layer 10 on the first functional material ink pattern layer 9 (step 1-2), and a step of patterning the second ink, film layer by the relief offset method (step 1-3). The method for forming patterns with two or more different materials on the same transfer plate can be realized by the same method as described above. Then, the third functional material ink film layer 12 is further applied on the composite pattern including two or more different materials on the transfer plate and is then reversely transferred to the printing object (substrate) to form an electronic part. The ink may be applied to completely cover the pattern or may be applied to a thickness equal to or smaller than the thickness of the pattern.

The functional material ink used in the present invention can be appropriately selected from, for example, a conductive ink, an insulating ink, a semiconductor ink, and a protective film forming ink according to the requirements for an electronic part to be manufactured. In the present invention, the functional material ink pattern layer and the ink film layer formed by printing on the printing object can be converted to functional material layers constituting the electronic part by the optimum method for the ink characteristics and the electronic part, for example, room-temperature drying, heat treatment, irradiation of ultraviolet light or electron beams, or the like.

Further, the present invention provides an organic transistor element including an organic semiconductor as at least one of the materials of the functional layers constituting an electronic part in the present invention, the method for forming an organic semiconductor layer is not particularly limited, and a method suitable for the organic semiconductor used, a functional material layer serving as a base layer, and a substrate can be appropriately selected. Examples of the method which can be applied include dry processes such as a vacuum deposition method, a chemical vapor deposition method, an ion plating method, and the like; and wet processes such as a spin coating method, a dip coating, dispenser coating, slit coating, a cast method, relief reversed transfer printing, screen printing, gravure printing, gravure offset printing, a micro contact method, relief offset printing, and the like. Among these, the relief offset printing method is the most preferred layer forming method because of the ease of control of the layer thickness, excellent printing positional precision, and the ease of fine patterning.

In the present invention, examples of the organic semiconductor material used for forming the organic semiconductor layer include, but are not limited to, low-molecular organic semiconductors, such as phthalocyanine derivatives, porphyrin derivatives, naphthalenetetracarboxylic acid diimide derivatives, fullerene derivatives, polycyclic aromatic compounds such as pentacene, triisopropylsilyl (TIPS) pentacene, fluorinated pentacene, fluorinated tetracene, perylene, tetracene, pyrene, phenanthrene, coronene, and the like, and derivatives thereof, oligothiophene and derivatives thereof, thiazole derivatives, fullerene derivatives, other low-molecular semiconductors including combination of thiophene, phenylene, vinylene, and the like, and organic semiconductor precursors which produce organic semiconductors by heating. Preferred examples of high-molecular compounds include polythiophene polymers such as polythiophene, poly (3-hexylthiophene), PQT-12, and the like; thiophene-thienothiophene copolymers such as B10TTT, PB12TTT, PB14111, and the like; fluorene polymers such as F8T2 and the like; phenylenevinylene polymers such as paraphenylenevinylene; arylamine polymers such as polytriarylamine and the like; soluble acene compounds such as TIPS pentacene, various pentacene precursors, and the like, and copolymers thereof.

Among these organic semiconductors, solvent-soluble organic semiconductors with which an ink can be easily formed, a functional layer and a pattern can be formed by the wet process, and a pattern can be formed by the relief offset method can be preferably used. Examples which can be preferably used as the solvent-soluble organic semiconductors include polythiophene polymers such as poly (3-hexylthiophene), PQT-12, and the like, thiophene-thienothiophene copolymers such as PB10TTT, PB12TTT, PB14TTT, and the like; fluorene polymers such as F8T2 and the like; phenylenevinylene polymers, triarylamine polymers, and TIPS pentacene.

The solvent, which can be applied to the organic semiconductor ink can dissolve the organic semiconductor at room temperature or by slightly heating, has proper volatility, and can form an organic semiconductor thin film after evaporation of the solvent. Examples of the solvent which can be preferably used include toluene, xylene, chloroform, anisole, methylene chloride, tetrahydrofuran, cyclohexane, mesitylene, chlorobenzene solvents such as dichlorobenzene, trichlorobenzene, and the like, mixed solvents containing two or more of these solvents.

In addition, for the purpose of improving ink characteristics, a surface energy adjuster such as a silicone-based or fluorine-based surfactant or the like can be added to a solution. In particular, the fluorine-based surfactant can be preferably used for a crystalline semiconductor solution because not only the ink characteristics are improved but also improvement in the characteristics, for example, enhanced electron field-effect mobility, of a semiconductor film formed by drying the ink can be expected.

A conductive ink, used for forming a conductor which can be used in the present invention may contain, as a conductive component in a proper solvent, particles of a metal such as gold, silver, copper, nickel, zinc, aluminum, calcium, magnesium, iron, platinum, palladium, tin, chromium, lead, or the like, an alloy of the metal, such as silver/palladium, a thermally decomposable metal compound such as silver oxide, organic solver, organic gold, or the like, which is thermally decomposed at relatively low temperature to produce a conductive metal, or particles of a conductive metal oxide such as zinc oxide (ZnO), indium tin oxide (ITO), or a conductive polymer such as polyethylenedioxythiophene/polystyrene sulfonate (PEDOT/PSS), polyaniline, or the like. In particular, the ink prepared by dispersing silver nano particles in the solvent and mixing with a release agent such as low-molecular silicone, and a surface energy adjuster such as the fluorine-based surfactant is suitable for the relief offset method and can be preferably used because it exhibits excellent patterning properties and high conductivity by low-temperature sintering.

An insulating ink used for forming an insulator which can be used in the present invention may contain a material which exhibits insulating properties. Examples of the material include epoxy resins, polyimide resins, polyvinyl pyrrolidone resins, polyvinyl alcohol resins, acrylonitrile resins, methacrylic resins, polyamide resins, polyvinylphenol resins, phenol resins, polyamide-imide resins, fluorocarbon resins, melamine resins, urethane resins, polyester resins, alkyd resins, and the like. These materials may be used alone or in combination of two or more. If required, high-dielectric-constant particles such as alumina fine particles, silica fine particles, or tantalum oxide fine particles, or low-dielectric-constant particles such as hollow silica fine particles may be added as a constituent. The solvent which can be applied to the insulating ink is not limited, and for example, water and various organic solvents such as a hydrocarbon solvent, an alcohol solvent, a ketone solvent, an ether solvent, an ester solvent, a glycol ether solvent, and the like can be used. If required, a silicone-based or fluorine-based surface energy adjuster can be added.

The protective film ink used for forming a protective film which can be used in the present invention may contain a material which forms a film having excellent barrier property against light, oxygen, water, ion, and the like by heating, light, electron beams, or drying. Examples of the material which can be used include resins which form organic films, such as polyacrylonitrile resins, polyvinyl alcohol resins, nylon resins, methacrylic resins, polyvinylidene chloride resins, fluorocarbon resins, epoxy resins, and the like, and compounds which form inorganic films by hydrolysis and, if required, heat treatment, such as silane compounds, silazane compounds, magnesium alkoxide compounds, aluminum alkoxide compounds, and tantalum alkoxide compounds. The ink solvent is not limited as long as it dissolves, or stably disperses the material used. For example, water and various organic solvents such as a hydrocarbon solvent, an alcohol solvent, a ketone solvent, an ether solvent, an ester solvent, and the like can be used.

EXAMPLES

Embodiments of the present invention are described below on the basis of the drawings.

Example 1

Formation of BGSC Organic Transistor Element

Figure 3:
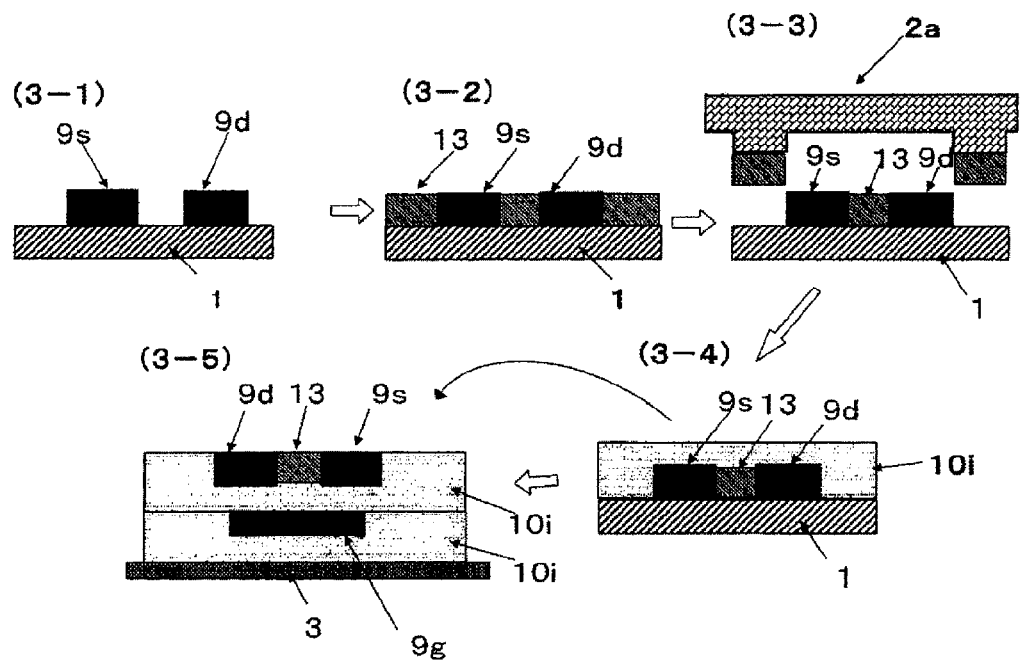
[FIG. 3]

As shown in FIG. 3, a source/drain electrode pattern 9s/9d was formed on a transfer plate 1 (3-1 of FIG. 3). The electrode pattern was formed using a conductive ink containing a fluorine-based surfactant. Then, a semiconductor ink containing P3HT as a main component was uniformly applied to the transfer plate 1, on which the pattern had been formed, using a capillary coater so that the thickness at a maximum after evaporation of the solvent was smaller than the thickness of the electrode, thereby forming an ink film layer 13 of P3HT (3-2 of FIG. 3). In this case, coating of the organic semiconductor ink on the electrode pattern was not observed.

Then, the organic semiconductor ink, excluding the organic semiconductor ink pattern remaining between the source and drain, was removed from the transfer plate 1 to leave the source/drain electrode pattern by the relief offset method using the same pattern as the relief plate for forming the electrode pattern except that the shape between the source and drain was reverse to the relief pattern for forming the pattern so that the source/drain pattern formed on the transfer plate 1 was aligned with the corresponding position of the pattern of the relief plate (3-3 of FIG. 3). Then, a gate insulating film ink was uniformly applied by a capillary coater to cover all the source/drain electrodes and the organic semiconductor layer formed on the transfer plate 1, forming an insulating ink film layer 10i (3-4 of FIG. 3).

Then, the insulating ink film layer 10i was aligned on a gate electrode pattern embedded in an insulating film by reverse transfer so that a gate electrode was disposed between the source and the drain electrodes through the insulating film and was disposed below the organic semiconductor layer, forming a laminated structure (3-5 of FIG. 3). Then, the resultant laminate was heat-treated on a hot plate at 150° C. for 40 minutes in a glove box to form a MIS organic transistor element structure having a bottom-gate side contact (BGSC) structure.

Example 2

Method for Manufacturing BGBC-type Organic Transistor Element

Figure 4:
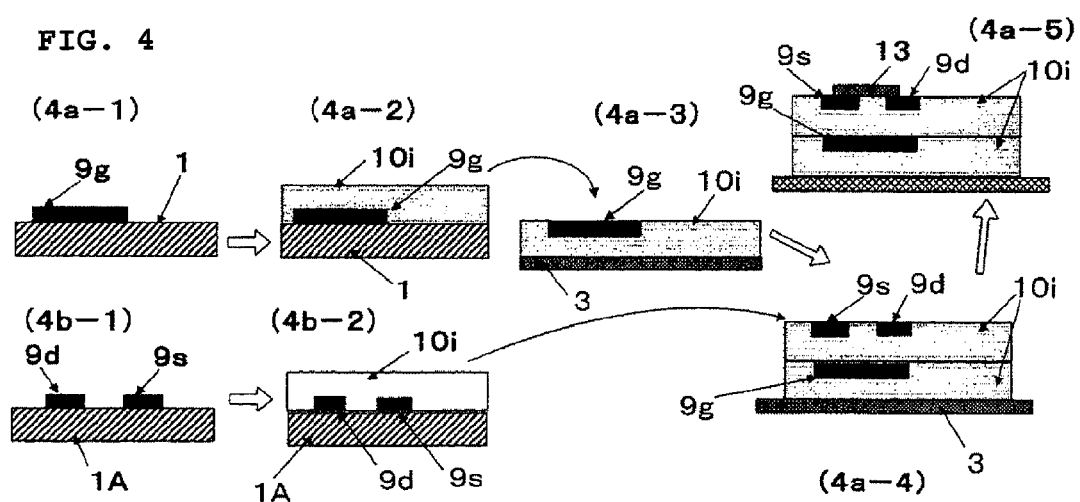
[FIG. 4]

A method for manufacturing a BGBC-type MIS organic transistor element is shown in FIG. 4.

(1) Formation of Gate Electrode

A relief offset printing conductive ink containing silver nano particles dispersed therein was uniformly applied by a capillary coater to the entire surface of a transfer plate 1 having a smooth releasing surface composed of a silicone resin. Then, a glass relief plate (not shown) was pressed on the ink surface to remove an excessive ink, forming a gate electrode pattern 9g on the transfer plate 1. Then, an insulating ink containing an epoxy resin and a polyvinyl phenol resin as main components was uniformly applied to the gate pattern 9g on the transfer plate 1 by using a capillary coater, forming an insulating ink film layer 10i. After being allowed to stand for about 1 minute, the insulating film ink, and the gate electrode pattern in a semidried state were reversely transferred to a plastic film (printing object 3) containing a polycarbonate as a main component, forming a surface of the insulating film ink in which the gate electrode was embedded (4a-3).

(2) Formation of Source/Drain Electrode

A source electrode 9a and a drain electrode 9d were formed on a transfer plate 1A by the same method as that for forming the embedded gate pattern using a conductive ink containing silver nano particles dispersed therein, and an insulating film was applied to the electrodes. Then, the electrodes were aligned so that the gate electrode was disposed between the source and drain electrodes through the insulating film and reversely transferred to the insulating film (4a-3 in FIG. 4) in which the gate electrode was embedded (4a-4 in FIG. 4). The resultant laminate including the conductive pattern and the insulating film was heat-treated on a hot plate at about 150° C. for about 40 minutes to form the conductive patterns by sintering the nano silver ink and form the insulating films by cross-linking the resin component of the insulating film ink.

(3) Formation of Semiconductor Layer

Then, a pattern was formed on a transfer plate having a releasing surface composed of a silicone resin by the relief offset method using a semiconductor ink prepared by dissolving poly(3-hexylthiophene) (P3HT) in xylene and adding a fluorine-based surfactant to the resultant solution (not shown in the process drawing), and the resultant pattern 13 was reversely transferred to the source/drain electrodes previously formed by sintering. As a result, a bottom-contact-type MIS organic transistor element was formed (4a-5 in FIG. 4).

Example 3

BGBC+Protective Film (with Via)+Pixel Electrode

Figure 5:
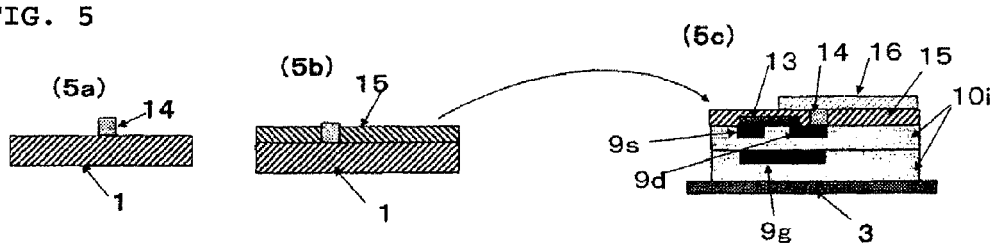
[FIG. 5]

As shown in FIG. 5a, a conductive pattern 14 serving as via was formed on a transfer plate having a smooth surface composed of a silicone resin by the relief offset method using a nano silver ink containing a liquid-repellent component including a fluorine-based surfactant. A coating film of a projective film forming ink containing an epoxy resin as a main component was uniformly applied to the nano-silver ink pattern previously formed so that the thickness was smaller than that of at least the conductive pattern, thereby forming a protective film ink layer 15. In this case, adhesion of the ink to the pattern was not observed. The protective film forming ink layer and the conductive pattern layer were simultaneously reversely transferred so that the conductive pattern 14 was in contact with the drain electrode 9d of the organic transistor formed in Example 1, followed by sintering at 140° C. for about 30 minutes.

Then, a pattern serving as a pixel electrode which was formed on the transfer plate 1 having a smooth releasing surface composed of a silicone resin by the relief offset method using a conductive ink containing PEDOT/PSS as a main component was reversely transferred to the protective film so as to overlap the via, and then heat-treated at 100° C. for 30 minutes in an oven. As a result, an organic TFT element structure having a pixel electrode 16 electrically connected to the drain electrode 9d through the protective film and the via was formed (5c).

Industrial Applicability

The present invention can be applied to manufacture of electronic parts such as a circuit board, REID, TFT, CMOS, memory, an organic EL element, various capacitors, an inductor, a resistor, and a solar cell, because of the characteristic of reducing the number of superpose-printing steps, forming precise superposed patterns, and resolving the problem of a difference in level in each layer, thereby improving productivity and dimensional precision and eliminating defects.

REFERENCE SIGNS LIST 1 transfer plate
1A transfer plate
2 relief stamp plate
2a second relief stamp plate
3 printing object (substrate)
4 ink film layer A
5 ink film layer B
6 ink film layer C
7 ink, film layer D
8 ink film layer E
9 first ink layer patterned by relief offset method
9G gate electrode
9S source electrode
9D drain electrode
10 second functional material ink film layer
10I Insulating film ink layer
11 second ink film layer
12 third functional material ink film layer
13 organic semiconductor ink film
14 conductive pattern for via
15 protective film ink layer
16 pixel electrode

The invention claimed is:

1. A method for manufacturing an electronic part comprising the steps of:
applying a functional material ink, which is selected from the group consisting of a conductive ink, an insulating ink, a semiconductor ink, and a protective film forming ink, to a mold releasing surface of a transfer plate;
forming an ink pattern layer by a relief offset method in which a relief plate is pressed on the functional material ink coated surface to remove the ink in a portion contacting the relief plate from the transfer plate, the ink pattern layer corresponding to a portion not contacting the relief plate;
forming a composite ink as the ink pattern layer including the functional material ink pattern layer and a layer of a different functional material ink that is laminated on the ink pattern layer and provided in parallel with the ink pattern layer so that the two layer are not mixed with each other, the different functional material ink being selected from the group consisting of a conductive ink, an insulating ink, a semiconductor ink, and protective film forming ink; and
reversely transferring the composite ink pattern layer to a printing object from the releasing surface of the transfer plate in such a manner that the outermost surface of the composite ink pattern layer faces the printing object.

2. A method for manufacturing an electronic part, comprising the steps of:

forming a plurality of ink layers by applying two or more layers of different functional material inks, which are selected from the group consisting of a conductive ink, an insulating ink, a semiconductor ink, and a protective film forming ink, to a mold releasing surface of a transfer plate so that the functional material inks are not mixed with each other;

forming a multilayer ink pattern by a relief offset method in which a relief plate corresponding to a non-image area is pressed on the ink coated surface of the plurality of functional material ink layer to remove the inks in a portion contacting the relief plate from the transfer plate, the multilayer ink pattern corresponding to a portion not contacting the relief plate; and reversely transferring the multilayer ink pattern to a printing object from the releasing surface of the transfer plate in such a manner that the outermost surface of the multilayer ink pattern faces the printing object.

3. The method for manufacturing an electronic part according to claim 1, comprising:

forming, on the mold releasing surface of the transfer plate, a first functional material ink pattern layer patterned with at least one functional material ink by the relief offset method (step 1);

superpose-coating the first patterned layer with a second functional material ink film layer (step 2); and simultaneously reversely transferring the first functional material ink pattern layer and the second functional material ink film layer to the printing object (laminate reverse transfer step).

4. The method for manufacturing an electronic part according to claim 3, wherein the second functional material ink film layer includes two or more superposed coating layers.

5. The method for manufacturing an electronic part according to claim 3, further comprising, after step 2, a step of removing a portion of the second functional material ink film layer or portions of the second functional material ink film layer and the first functional ink pattern layer by the relief offset method (removal step).

6. The method for manufacturing an electronic part according to claim 5, further comprising, after the removal step, a step of forming a third functional material ink film layer (step 3).

* * * * *